US011928409B2

(12) United States Patent
Lewis et al.

(10) Patent No.: US 11,928,409 B2
(45) Date of Patent: Mar. 12, 2024

(54) DYNAMIC ABSTRACT GENERATION AND SYNTHESIS FLOW WITH AREA PREDICTION

(71) Applicant: International Business Machines Corporation, Armonk, NY (US)

(72) Inventors: Daniel Lewis, Bangalore (IN); Rahul M Rao, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 17/567,328

(22) Filed: Jan. 3, 2022

(65) Prior Publication Data

US 2023/0214563 A1    Jul. 6, 2023

(51) Int. Cl.
*G06F 30/30* (2020.01)
*G06F 30/27* (2020.01)
*G06F 30/323* (2020.01)
*G06F 30/327* (2020.01)
*G06F 30/39* (2020.01)

(52) U.S. Cl.
CPC .......... *G06F 30/327* (2020.01); *G06F 30/323* (2020.01); *G06F 30/39* (2020.01)

(58) Field of Classification Search
None
See application file for complete search history.

(56) References Cited

U.S. PATENT DOCUMENTS

| 8,332,798 | B2 | 12/2012 | Chandra et al. | |
| 8,762,919 | B2 | 6/2014 | Keinert et al. | |
| 10,102,320 | B2 * | 10/2018 | Pataky | G06F 30/327 |
| 11,630,930 | B2 * | 4/2023 | Chen | G06F 30/30 |
| | | | | 716/132 |
| 11,663,381 | B2 * | 5/2023 | Shuma | G06F 30/31 |
| | | | | 716/103 |
| 2021/0334445 | A1 * | 10/2021 | Goldie | G06F 30/392 |

OTHER PUBLICATIONS

W.-K. Cheng et al., "Evaluation of Routability-driven Macro Placement with Machine-Learning Technique," The 7th Int'l Symposium of Next-Generation Electronics (ISNE 2018), 3 pages. (Year: 2018).*

(Continued)

*Primary Examiner* — Leigh M Garbowski
(74) *Attorney, Agent, or Firm* — Cantor Colburn LLP; Nathan Rau

(57) ABSTRACT

A computer-implemented method includes receiving, by a processor, a physical design block and a physical hierarchy of a chip design of a chip. Further, the method includes extracting, by the processor, one or more features of a macro to be added to the chip design based on a logic synthesis of the chip design. Further, the method includes predicting, by the processor, specifications of the macro to be added to the chip design based on the physical design block, the predicting performed using a pre-trained machine learning model. Further, the method includes using, by the processor, the specifications of the macro to perform a physical synthesis of the chip design to determine a physical layout of the chip.

20 Claims, 6 Drawing Sheets

(56) References Cited

OTHER PUBLICATIONS

W.-K. Cheng et al., "Machine Learning Techniques for Building and Evaluation of Routability-driven Macro Placement," 2019 IEEE Int'l Conference on Consumer Electronics—Taiwan (ICCE-TW), 2 pages. (Year: 2019).*
A. Mirhoseini et al., "A graph placement methodology for fast chip design," Nature, vol. 594, Jun. 10, 2021, pp. 207-212, 23 pages total. (Year: 2021).*
Huang et al., "Machine Learning for Electronic Design Automation: A Survey," ACM Transactions on Design Automation of Electronic Systems, Jun. 2021, pp. 1-44.
Huang et al., "Routability-Driven Macro Placement with Embedded CNN-Based Prediction Model," 2019 Design, Automation & Test in Europe Conference & Exhibition, May 16, 2019, pp. 180-185.
Menager et al., "Dynamic Floorplanning: A Practical Method Using Relative Dependencies for Incremental Floorplanning," Design & Reuse, Aug. 31, 2021, 9 pages.
Mirhoseini et al., "Chip Placement with Deep Reinforcement Learning," Arxiv.org, arXiv:2004.10746v1 [cs.LG] Apr. 22, 2020, 15 pages.
Mohan et al., "Effective Usage of Chip Area by Optimizing the Dead Space," International Journal of Engineering and Advanced Technology, ISSN: 2249-8958, vol. 8, No. 6, Aug. 2019, pp. 2601-2603.
Nemani et al., "High-Level Area and Power Estimation for VLSI Circuits," IEE Transactions on Computer-Aided Design of Integreated Circuits and Systems, vol. 18, No. 6, Jun. 1999, 17 pages.

\* cited by examiner

DYNAMIC ABSTRACT GENERATION AND SYNTHESIS FLOW WITH AREA PREDICTION

BACKGROUND

The present invention generally relates to electronic circuit design and manufacture, particularly to placement and routing of electronic circuit designs for integrated circuits, and more particularly to using machine learning to improve physical characteristics of an electronic circuit entity by dynamically generating abstract nodes and performing synthesis flow for the electronic circuit design.

When designing an integrated circuit ("IC") or chip, the logic to be performed by the chip is partitioned into portions. Each portion is assigned to a predefined area of the chip. Each portion can include area, logic, interconnects and timing assertions, and is typically referred to as a "macro." Usually, the macro itself may not be assigned any logic. Rather, the logic is considered to be at the top level of the hierarchy. In a hierarchical view, the logic of the chip is nested such that the chip is partitioned into one or more units, and each unit is partitioned into one or more macros. The top level is typically referred to as a "unit" and the lower level(s) as "macros."

A port of a macro is the point (or small area) at which the internal and external signals are connected to each other. Generally, a design team provides guidelines on which ports should be close to each other. The guidelines can also provide size of the macro as well as the x- and y-dimensions of the macro. During unit/chip floorplan optimization these fixed macro outlines are varied to find the optical locations of the macros so that they are non-overlapping and with minimum net-length between ports.

SUMMARY

A computer-implemented method includes receiving, by a processor, a physical design block and a physical hierarchy of a chip design of a chip. Further, the method includes extracting, by the processor, one or more features of a macro to be added to the chip design based on a logic synthesis of the chip design. Further, the method includes predicting, by the processor, specifications of the macro to be added to the chip design based on the physical design block, the predicting performed using a pre-trained machine learning model. Further, the method includes using, by the processor, the specifications of the macro to perform a physical synthesis of the chip design to determine a physical layout of the chip.

According to one or more embodiments of the present invention, a system includes a memory, and one or more processing units coupled with the memory, the one or more processing units are configured to perform a method to support a design cycle of a chip. Performing the method includes receiving a physical design block and a physical hierarchy of a chip design of the chip. Further, the method includes extracting one or more features of a macro to be added to the chip design based on a logic synthesis of the chip design. Further, the method includes predicting specifications of the macro to be added to the chip design based on the physical design block, the predicting performed using a pre-trained machine learning model. Further, the method includes using the specifications of the macro to perform a physical synthesis of the chip design to determine a physical layout of the chip.

According to one or more embodiments of the present invention, a computer program product comprising a computer-readable memory that has computer-executable instructions stored thereupon, the computer-executable instructions when executed by a processor cause the processor to perform a method. Performing the method includes receiving a physical design block and a physical hierarchy of a chip design of the chip. Further, the method includes extracting one or more features of a macro to be added to the chip design based on a logic synthesis of the chip design. Further, the method includes predicting specifications of the macro to be added to the chip design based on the physical design block, the predicting performed using a pre-trained machine learning model. Further, the method includes using the specifications of the macro to perform a physical synthesis of the chip design to determine a physical layout of the chip.

The above-described features can also be provided at least by a system, a computer program product, and a machine, among other types of implementations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
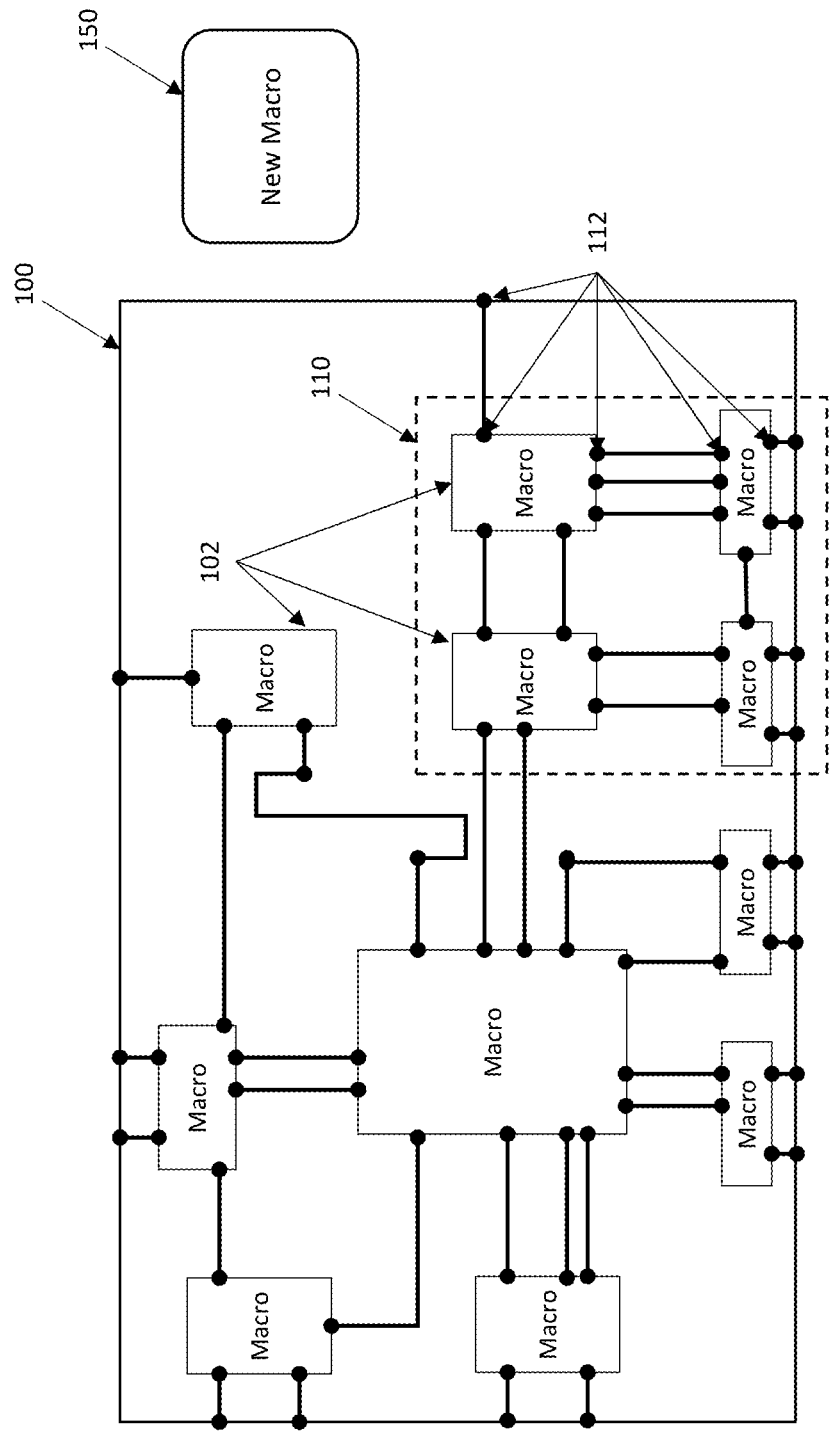
FIG. 1 depicts a block diagram of a logic design of a chip according to one or more embodiments of the present invention.

The diagrams depicted herein are illustrative. There can be many variations to the diagrams, or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number corresponds to the figure in which its element is first illustrated.

DETAILED DESCRIPTION

Technical solutions are described herein to improve integrated circuit design and more particularly to improve a computer-implemented method to design an integrated circuit (IC) or chip by using machine learning to provide optimal dimensions, optimal physical placement, and timing insights for placing macros of the chip. Further, the technical solutions described herein provide such optimal design, and in some cases, multiple design possibilities in real time. The technical solutions described herein address a technical challenge that is faced during electronic circuit designing. For example, whenever there is a new macro definition, or if a new macro is created by merging existing macros or splitting existing macros, it is uncertain what the size of that new macro should be. Here, uncertainty of the "size" the macro can stem from several factors such as dimensions, aspect ratio, placement on an existing circuit (with existing macros), meeting timing guidelines, etc. Physically experimenting several possibilities of with different combinations of the numerous factors is not only resource and time intensive, but also impractical.

Existing solutions to address such technical challenges include using a "static" metric like sq.mm/latch to formulate an initial macro size based on a latch count to block-area based on block definitions (sq.mm—square millimeters). Here, a "block" is a component being used in the macro, or the existing chip to which the new macro is to be added. However, such existing techniques do not take macro specific features into consideration. Further, such techniques, which are based on a single factor such as latch count, and are not dependent on an entire bill of materials (of the macro) or connectivity between the components of the macro, result in inaccurate and ultimately inefficient estimation. Some other existing techniques have proposed using complex mathematical formulations to provide estimates of the new macro. However, even with several compute-intensive complications, such techniques are only valid for combinatorial blocks, and do not work with multi-stage sequential circuits (which are most common). Further yet, such techniques do not take account of sequential blocks or clocking circuitry associated with the new macro.

Yet other existing techniques that provide a more accurate estimate of the new macro require a physical abstract and also that inputs for a synthesis flow be manually generated by the designer. Both these conditions can lead to inaccuracies, human errors, but moreover a large amount of time. To circumvent these drawbacks, sometimes a previous iteration of the chip is used to provide the physical abstract. However, such a workaround is limited in that if logic is removed from the previous iteration, then the abstract from the previous abstract may be large, resulting in large wire delays and inefficiencies, and moreover non-compliance with the guidelines. And, if logic added, the previous abstract size may not be sufficient, and thus, lead to inaccurate macro design. While, logic planners that do not require physical abstract exist, such computer-implemented methods do not take the physical characteristics into account when designing the macro, thus not addressing the technical challenge to begin with.

The technical solutions described herein address the technical challenges and overcome the limitations of the existing solutions to provide an improved computer-implemented method to provide estimated macro design. One or more embodiments of the present invention facilitate, based on logic synthesis (technology mapping and bill of materials), dynamically predicting the required physical area (and aspect ratio) for the new macro. Further, embodiments of the present invention facilitate extracting features from an initial technology mapping step automatically. Further, embodiments of the present invention provide an estimated aspect ratio of the macro using 'connectivity' and bill of materials.

Embodiments of the present invention provide one or more features described herein by using machine learning models, for example, using artificial neural networks. In one or more embodiments of the present invention, the machine learning models are used for auto-creation of abstract and physical synthesis enablement. For example, the machine learning models set the required parameters to create the abstract. Further, the machine learning models set the hooks to determine placement of the one or more blocks and interior pins of the macro. The machine learning models also run synthesis.

Accordingly, embodiments of the present invention provide logic synthesis in an automated manner. A bill of materials can be input or determined based on technology mapping. Based on the bill of material, embodiments of the present invention identify a macro specific "signature." Such a signature is used in determining the required physical area and aspect ratio of the new macro.

Further, the machine learning model that is used for estimating the macro design can be periodically re-tuned and retrained as newer factors and preferences are developed. Further, because the machine learning model can account for several factors and combinations thereof, the estimated macro design eliminates use of a static factor such as the "sq.mm/latch" that is commonly used at present. In other words, the macro design that is estimated by the machine learning model is a function of the entire bill of materials, not just a single factor (such as latch/count), as well as the connectivity (e.g., provided in the guidelines). The retuning of the machine learning model can also facilitate synthesis improvements, for example, using new library components etc. that are added with time.

Additionally, one or more embodiments of the present invention provide a flow which minimizes physical information necessary, and enables fast feedback to the logic designer and enables full synthesis. For example, by using interior pins, removes unnecessary buffering between macro edge and first logical component. Further, default assertions are generated on the fly (although previous iteration results can be used if available).

Accordingly, one or more embodiments of the present invention facilitate continuous integration (no human in the loop) and removes manual errors during design and synthesis of a circuit design.

Turning now to FIG. 1, a block diagram depicts logic design of a chip 100 according to one or more embodiments of the present invention. The logic of the chip 100 is partitioned into smaller portions that are assigned to predefined areas of the chip 100. The design portions (which may comprise area, logic, interconnects, timing assertions, etc.) are typically referred to as macros 102. Several macros 102 are illustrated in FIG. 1. Each macro 102 contains respective combinational logic circuits or components. The macros 102 may also contain sequential logic in some examples.

Typically, a macro is not assigned any logic. The logic is considered as being at a "higher level" of the hierarchy in the chip design. It may well be that the hierarchy is nested and the chip 100 is partitioned into one or more units, with each unit being partitioned into one or more macros 102. Sometimes, the higher level is referred to as a "unit" and the lower level(s) as the "macros." A unit 110 is illustrated in FIG. 1. It is understood that the chip 100 can include several units, although only one unit is depicted for illustrative purposes. Also illustrated are several input/output ports 112 for the chip 100, the unit 110, and the several macros 102. It is further understood that the design of the chip 100 is illustrative and that in a typical design that is handled by one or more embodiments of the present invention, the chip 100 includes a much larger number (thousands, millions, etc.) of ports 112, macros 102, and units 110.

Embodiments of the present invention facilitates estimating a design and several parameters of a new macro 150 that is to be added to the chip 100. The new macro 150 can be based on merging or splitting one or more existing macros 102. Alternatively, or in addition, the new macro 150 can be an entirely new, independent of the existing macros 102. The new macro 150 has to be compliant with the one or more guidelines, such as timing constraints, connector distance/lengths, etc., associated with the design of the chip 100. As described herein, embodiments of the present invention, based on logic synthesis (technology mapping and bill of materials), predict the required physical area (and aspect ratio) for the new macro 150 on the fly, i.e., dynamically. Further, embodiments of the present invention facilitate using machine learning models for auto-creation of abstract and physical synthesis enablement.

In one or more embodiments of the present invention, the prediction can be done in real-time, so that a user can alter one or more input parameters, and receive an updated prediction in response.

Figure 2:
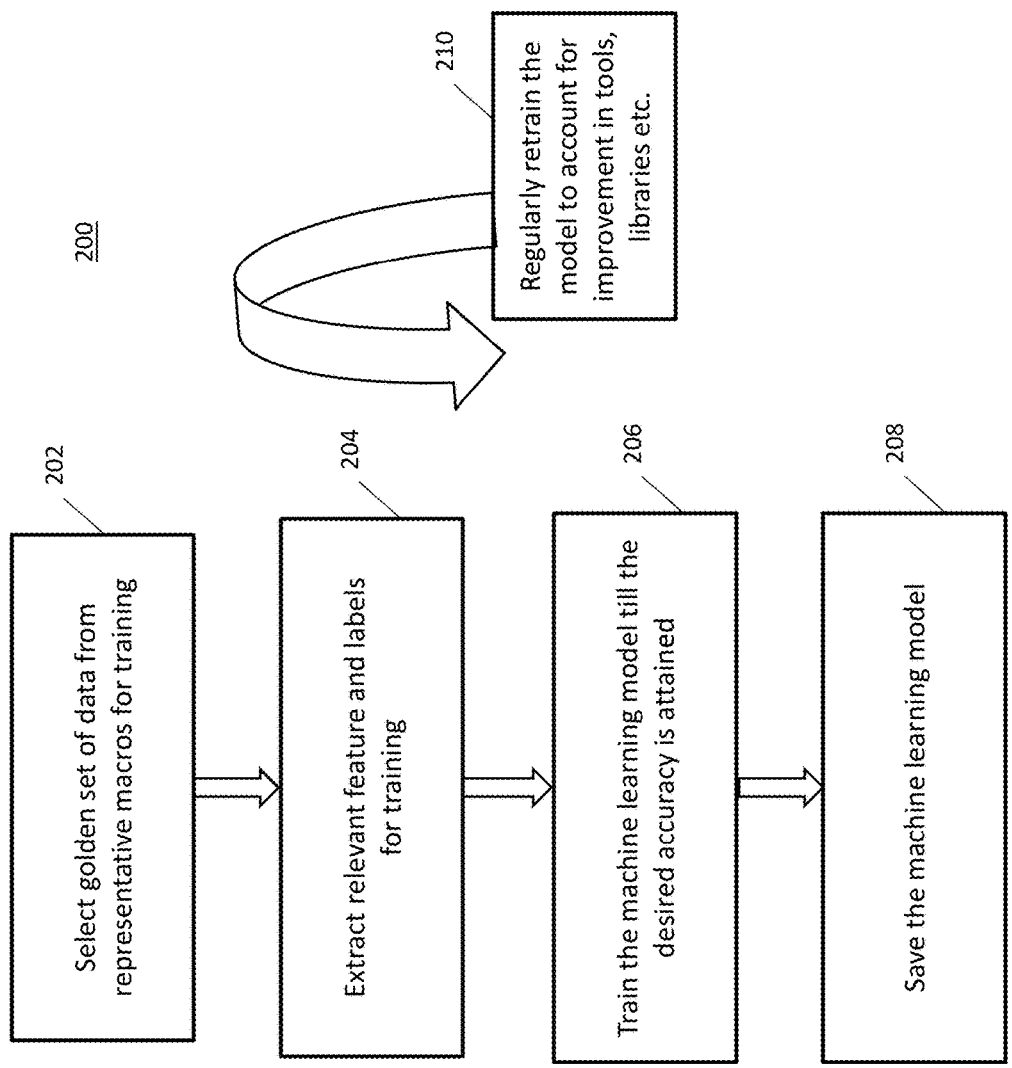
FIG. 2 depicts a flowchart of a method for training a machine learning model according to one or more embodiments of the present invention.

FIG. 2 depicts a flowchart of a method 200 for training a machine learning model according to one or more embodiments of the present invention. The method 200 can be performed using a computing system that is separate from the computing system that a logic designer uses to design/update the design of the chip 100 to add the new macro 150. The method 200 can be performed before the designing of the new macro 150.

The method 200 includes, at block 202, selecting a "golden" set of data from representative macros for training the machine learning model. The golden set of data can include one or more macros that have been designed in the past, and for which the applicable data is available.

The applicable data can include input data such as bill of material. The bill of material of the new macro 150 specifies the components that are to be included in that new macro 150. The components can include transistors, capacitors, inductors, connectors, ports, resistors, digital logic components, or any other electronic components that are to be included in the new macro 150. The bill of materials can be provided in an electronic format such as, an electronic file (e.g., extended markup language file (XML), etc.), a database table, or any other format that can be parsed by the computing system.

The applicable data can further include output data such as a physical design of the new macro 150 that is designed using the bill of materials that is input. The physical design of the new macro 150 specifies dimensions, aspect ratio, floorplan, and other attributes of the physical layout of the new macro 150.

Accordingly, the golden set of data provides a training data that includes several examples of physical designs of new macros 150, and the corresponding bills of material for those new macros 150. In addition, in one or more embodiments of the present invention, the training data can include the guidelines/constraints that were applied when designing the new macros 150.

At block 204, relevant features are extracted from the training data and labelled. The labelling can be performed manually for the training data in one or more embodiments of the present invention. The features that are extracted can include dimensions of the components (which can be determined using database(s)), connectivity constraints (e.g., number of connectors), port placement constraints, count of sequential elements [sequential area], combinational elements [combinatorial area], number of connectivity of each component, number of primary input ports, number of output ports, number of third party IP or hard blocks, etc. Several other features can be extracted in other embodiments of the present invention.

At block 206, a machine learning model is trained to generate estimates of the physical designs of the new macros 150 using the training data. The training is performed until a desired accuracy is attained. The machine learning model can be a regression model, an artificial neural network (e.g., convolutional neural network, recurrent neural network, encoder-decoder, deep neural network, or any other type of neural network or a combination thereof), support vector regression (SVR), etc. In one or more embodiments of the present invention, the machine learning model is a multi-output regression model, where the multiple outputs include at least the area and aspect ratio of the macro that is being estimated.

Figure 3:
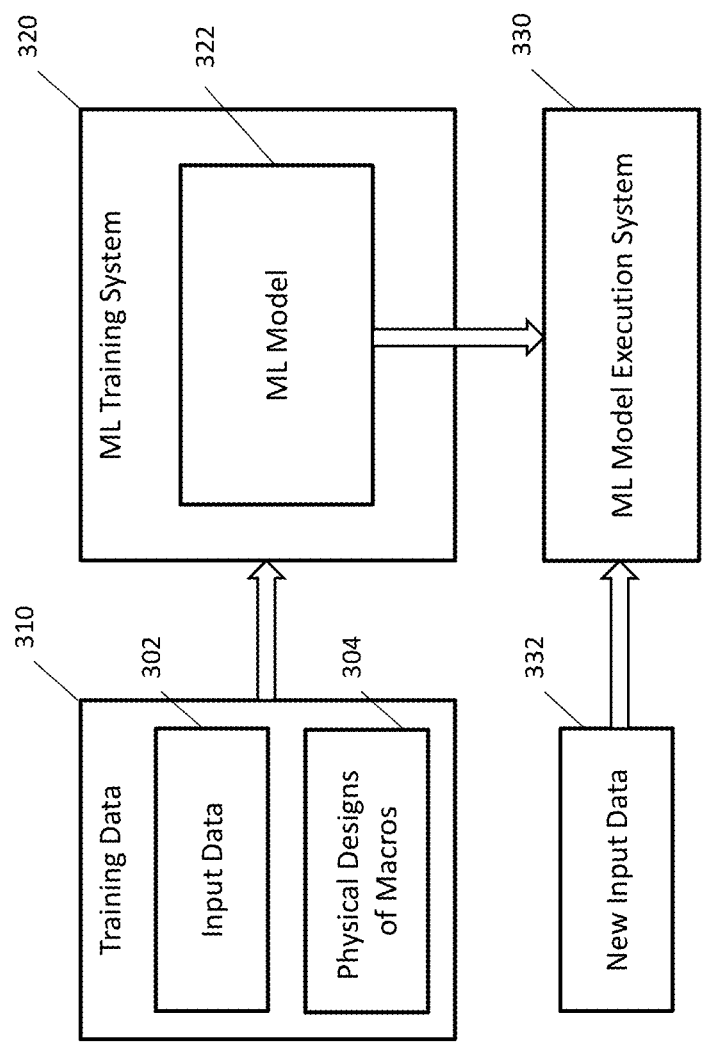
FIG. 3 depicts a block diagram of the training process according to one or more embodiments of the present invention.

FIG. 3 depicts a block diagram of the training process according to one or more embodiments of the present invention. The training data 310 includes the input data 302 and the physical attributes 304 of the new macros 150. A machine learning training system 320 uses the input data 302 of a macro to generate an estimated physical design using a machine learning model 322. The estimated physical design is compared with the actual physical design of that macro. If the difference between the estimated physical design and the actual physical design is greater than a predetermined threshold, i.e., the desired accuracy of the machine learning models 322 is not attained, one or more attributes (e.g., hyperparameters, weights, etc.) of the machine learning model 322 are changed. The machine learning model 322 is used to generate another estimated physical design, which is compared with the actual physical design. This process is repeated until the machine learning model 322 generates an estimated physical design that is within the predetermined threshold of the actual physical design.

The machine learning model 322 is trained with all of the input data 302 and physical designs 304 in the training data 310. In this way the attributes of the machine learning model 322 are adjusted several times during the training. The attributes can include hyperparameters, weights, and other such parameters associated with the machine learning model 322.

Referring to FIG. 2, at block 208, the trained machine learning model 322 is stored so that the trained machine learning model 322 can be used to generate an estimated physical design for the new macro 150 with input data 332 for which an actual physical design is unknown. The estimated physical design of the new macro 150 is used with a certain confidence level based on the accuracy of the machine learning model 322.

In one or more embodiments of the present invention, the machine learning model 322 is regularly retrained to account for improvement in tools, libraries, etc., at block 210. The retrained machine learning model 322 is stored and made available for execution.

The machine learning model 322 can be executed by an execution system 330 to generate the new macro 150 with the new (unseen) input data 332. The execution system 330 can be different from the training system 320 in some embodiments of the present invention. In one or more embodiments of the present invention, the machine learning model 322 is stored in the "cloud" so that it can be accessed by any computing system that has access to the cloud, turning that computing system into the execution system 330.

Figure 4:
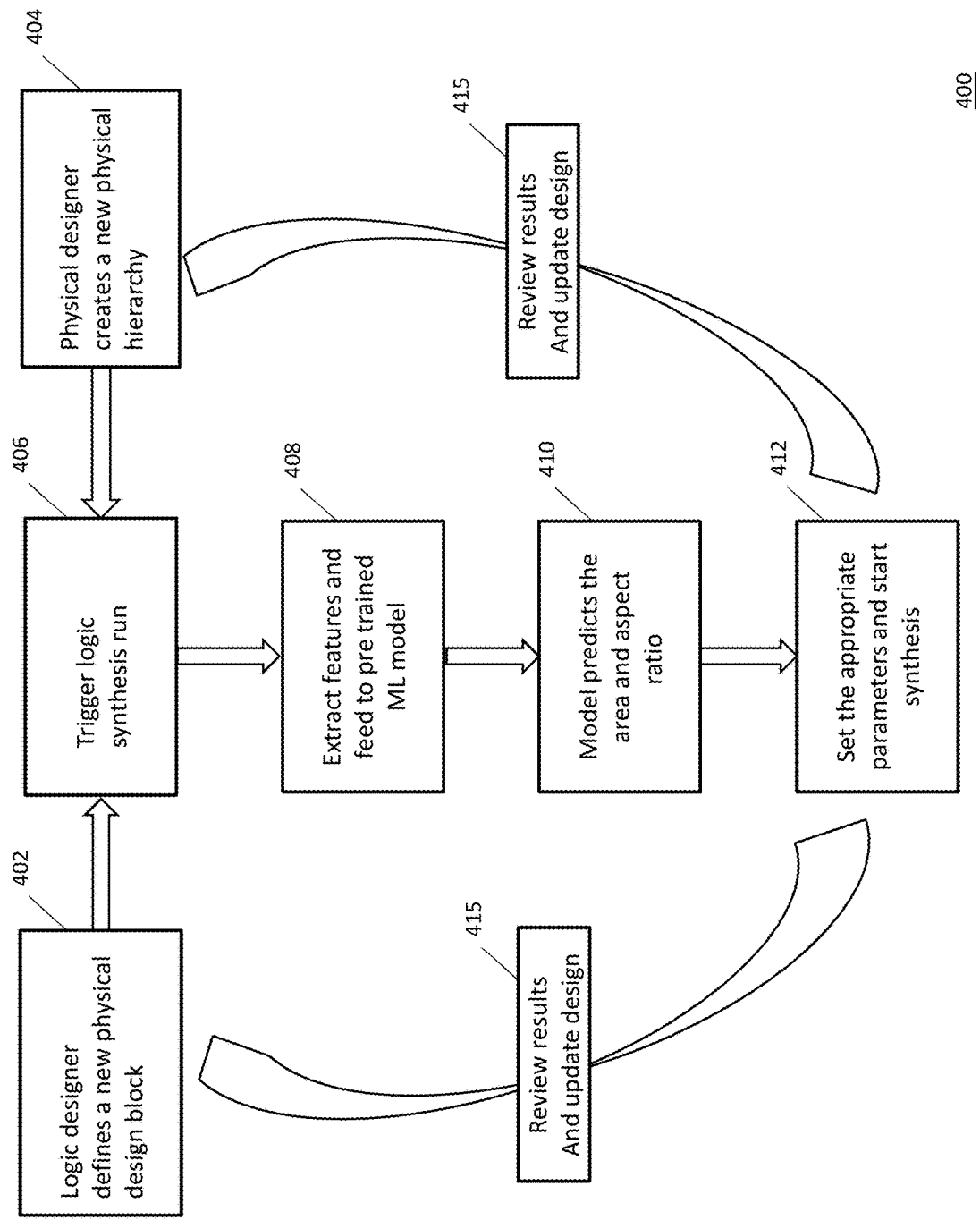
FIG. 4 depicts a flowchart of a method for using the machine learning model to generate a new macro according to one or more embodiments of the present invention.

FIG. 4 depicts a flowchart of a method 400 for using the machine learning model 322 to generate a new macro 150 according to one or more embodiments of the present invention. The method 400 includes, at block 402, a logic designer defining a new physical design block to be included in the chip 100. The physical design block contains the details of the input and output pins, block instantiations, design connectivity, clock and reset strategy, and so on. In some examples, the physical design block is specified using hardware design languages (HDLs), such as very high speed integrated circuit hardware description language (VHDL) and Verilog, and/or schematic capture.

In one or more embodiments of the present invention, at block 404, a physical designer creates a new physical hierarchy of the chip 100 that includes the new physical design block.

At block 406, a logic synthesis run for the design of the chip 100 is triggered. The logic synthesis uses the new physical design block and logic hierarchy. Synthesis is the process of converting the design's register transfer language (RTL) code into an optimized gate-level representation, given a technology library and design constraints. The following steps are performed in the logic synthesis: Translation: The design RTL code is translated into a technology-independent Boolean equation; Optimization: The Boolean equation is optimized, and any redundant logic is removed; Technology mapping: The technology independent Boolean equation is mapped to the technology-dependent logic gates with the help of the design constraints and the technology library.

At block 408, using the output of the logic synthesis, features are extracted from the design of the chip 100 and fed to the pre-trained machine learning model 322. For example, the logic synthesis provides connectivity of the one or more components in the chip 100. Further, the logic synthesis can provide the bill of materials to be used for the chip 100. The machine learning model 322 is trained as described herein (see FIG. 2, for example). The extracted features are fed as the new input data 332 to the execution system 330.

An example of extracting the features and providing them as input to the machine learning model 322 is provided in table 1. A script file is created for each new macro 150. Table 1 uses UNIX® KSH® as an example platform for generating and executing the scripts for executing the machine learning model 322, however, it is understood that the machine learning model can be executed by the execution system 330 in any other manner. For example, in one or more embodiments of the present invention, the machine learning model 322 can be accessed via a graphical user interface.

The user can specify a name for the macro. Further, the user can provide additional constraints (such as highest level of metal that can be used by the macro) or optimization options (such as optimized for leakage power, or optimized to artificially expand all library cells to ease macro routability) as parameters for the macro. In some examples, the user can provide aspect ratio and uplift factor of the macro as parameters, which are used as constraints by the machine learning model 322. If such parameters are not provided, default values can be used, such as 1:1 for aspect ratio, and 1.0 for uplift factor. In some examples, a percentage pin file from original design guidelines is provided for additional constraints for the machine learning model 322. It is understood that the names of the scripts and parameters can be varied in one or more embodiments of the present invention.

Based on logic synthesis (technology mapping and bill of materials) the machine learning model 322 predicts the required physical area and aspect ratio of the new macro 150 on the fly. The machine learning model 322 generates the estimate based on the extracted features. Further, the machine learning model 322 determines the aspect ratio of the macro based on the connectivity and bill of materials, where the connectivity is determined based on the logic synthesis.

TABLE 1

Create an executable script per macro (e.g.: MACRO150.ksh, chmod +x MACRO150.ksh) with following content in $CTEUSRHOME
- run_create_abstract.ksh <Macro> <optimization option> <Ceiling> <aspect ratio> <uplift factor> <pinfile>

The execution of the script for a new macro 150 generates an output file with specifications for the new macro 150, at block 410. The machine learning model 322 generates specifications that include the area, aspect ratio, dimensions, and other such attributes of the new macro 150. In one or more embodiments of the present invention, the output file that is generated by the machine learning model 322 includes abstracts (i.e., boundary boxes) along with design information for one or more components to be included in the new macro 150.

In one or more embodiments of the present invention, the machine learning model 322 is used to generate all of the new macros 150 to be added to the design of the chip 100. For example, if there are two or more new macros 150 to be added, using respective input data 332, respective specifications for the new macros 150 are generated.

At block 412, the specifications of the new macro(s) 150 are used to set the appropriate parameters and start a physical synthesis. Here, the physical synthesis (detailed synthesis that includes physical characteristics, placement and electrical validation) is performed to determine a physical layout of the chip 100 with the new macro 150 added. Table 2 provides examples of triggering a physical synthesis using the new macro 150. The output file generated by the machine learning model 322 is copied to a predetermined location, which is used as an input to the logic synthesis. Alternatively, or in addition, the output file from the machine learning model 322 is used as an input to the logic synthesis. Further, in one or more embodiments of the present invention, the machine learning model 322 is configured to place one or more components automatically. The physical synthesis is then completed using the same parameters as were used as the execution of the machine learning model 322, for example, using the same optimization option(s). The physical synthesis facilitates mapping the incoming RTL/HDL (hardware description) to the bill of materials (what components are required).

Accordingly, one or more embodiments of the present invention facilitate setting the required parameters to create the abstract of the new macro 150. Further, embodiments of the present invention facilitate additional constraints (such as metal patterns or blockages) to facilitate placement of components and interior pins and run physical synthesis.

TABLE 2

Copy generated file to predetermined location
* Run synthesis using the same optimization options specified in the script file.

The resulting design of the chip 100 can be reviewed and the logic designer and/or the physical designer can change their respective inputs (402, 404), at blocks 415. In this way, a continuous integration can be performed if any of the inputs are adjusted, where such adjustments result in the method 400 being executed in response.

Figure 5:
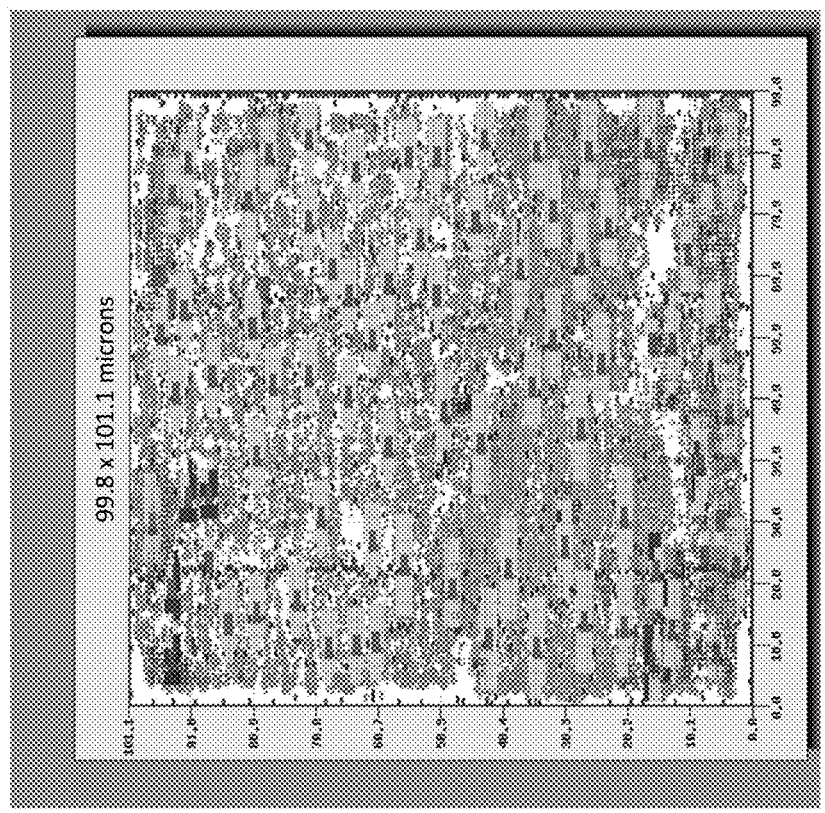
FIG. 5 depicts example result of an automatically generated macro designed using one or more embodiments of the present invention.

FIG. 5 depicts example results of updated macro design using one or more embodiments of the present invention. The depicted design 600 was automatically created by a machine learning model using only the logic definition of the design without any manual inputs.

Accordingly, embodiments of the present invention facilitate estimating, using machine learning, a physical size of a macro that is to be added to a chip design. Further, in one or more embodiments of the present invention, placement of components inside the macro can also be estimated using machine learning. Because of overlap in functions, the macro size can be different than just a combination of all hardware components of functions to be combined in the macro. Embodiments of the present invention address and overcome such technical challenge using machine learning. Further, one or more embodiments of the present invention provide timing insights along with area insights. In one or more embodiments of the present invention, a bill of material is used as an input, where features from the bill of material are extracted to generate the estimate of the macro using a multi-output regression model. Using logic synthesis connectivity of the macro and the chip design is also determined.

Figure 6:
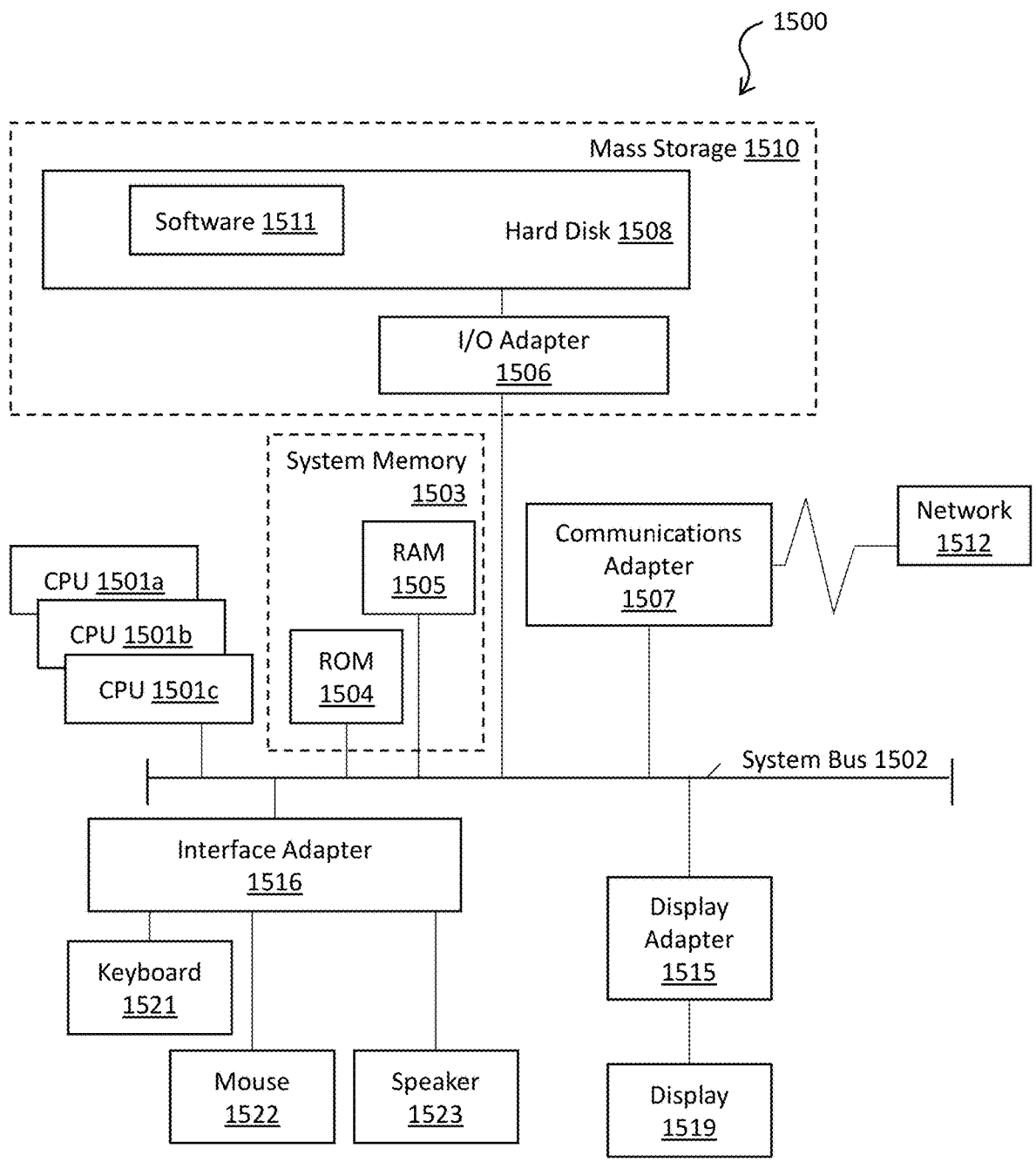
FIG. 6 depicts a computing system according to one or more embodiments of the present invention.

Turning now to FIG. 6, a computer system 1500 is generally shown in accordance with an embodiment. The computer system 1500 can be a computing device, server, or any other component of the system described herein, or the system itself. The computer system 1500 can be used as the machine learning model training system 320, and/or the machine learning model execution system 330. The computer system 1500 can be an electronic, computer framework comprising and/or employing any number and combination of computing devices and networks utilizing various communication technologies, as described herein. The computer system 1500 can be easily scalable, extensible, and modular, with the ability to change to different services or reconfigure some features independently of others. The computer system 1500 may be, for example, a server, desktop computer, laptop computer, tablet computer, or smartphone. In some examples, computer system 1500 may be a cloud computing node. Computer system 1500 may be described in the general context of computer system executable instructions, such as program modules, being executed by a computer system. Generally, program modules may include routines, programs, objects, components, logic, data structures, and so on that perform particular tasks or implement particular abstract data types. Computer system 1500 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, the computer system 1500 has one or more central processing units (CPU(s)) 1501a, 1501b, 1501c, etc. (collectively or generically referred to as processor(s) 1501). The processors 1501 can be a single-core processor, multi-core processor, computing cluster, or any number of other configurations. The processors 1501, also referred to as processing circuits, are coupled via a system bus 1502 to a system memory 1503 and various other components. The system memory 1503 can include a read only memory (ROM) 1504 and a random access memory (RAM) 1505. The ROM 1504 is coupled to the system bus 1502 and may include a basic input/output system (BIOS), which controls certain basic functions of the computer system 1500. The RAM is read-write memory coupled to the system bus 1502 for use by the processors 1501. The system memory 1503 provides temporary memory space for operations of said instructions during operation. The system memory 1503 can include random access memory (RAM), read only memory, flash memory, or any other suitable memory systems.

The computer system 1500 comprises an input/output (I/O) adapter 1506 and a communications adapter 1507 coupled to the system bus 1502. The I/O adapter 1506 may be a small computer system interface (SCSI) adapter that communicates with a hard disk 1508 and/or any other similar component. The I/O adapter 1506 and the hard disk 1508 are collectively referred to herein as a mass storage 1510.

Software 1511 for execution on the computer system 1500 may be stored in the mass storage 1510. The mass storage 1510 is an example of a tangible storage medium readable by the processors 1501, where the software 1511 is stored as instructions for execution by the processors 1501 to cause the computer system 1500 to operate, such as is described herein below with respect to the various Figures. Examples of computer program product and the execution of such instruction is discussed herein in more detail. The communications adapter 1507 interconnects the system bus 1502 with a network 1512, which may be an outside network, enabling the computer system 1500 to communicate with other such systems. In one embodiment, a portion of the system memory 1503 and the mass storage 1510 collectively store an operating system, which may be any appropriate operating system, such as the z/OS or AIX operating system from IBM Corporation, to coordinate the functions of the various components shown in FIG. 6.

Additional input/output devices are shown as connected to the system bus 1502 via a display adapter 1515 and an interface adapter 1516 and. In one embodiment, the adapters 1506, 1507, 1515, and 1516 may be connected to one or more I/O buses that are connected to the system bus 1502 via an intermediate bus bridge (not shown). A display 1519 (e.g., a screen or a display monitor) is connected to the system bus 1502 by a display adapter 1515, which may include a graphics controller to improve the performance of graphics intensive applications and a video controller. A keyboard 1521, a mouse 1522, a speaker 1523, etc. can be interconnected to the system bus 1502 via the interface adapter 1516, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 6, the computer system 1500 includes processing capability in the form of the processors 1501, and, storage capability including the system memory 1503 and the mass storage 1510, input means such as the keyboard 1521 and the mouse 1522, and output capability including the speaker 1523 and the display 1519.

In some embodiments, the communications adapter 1507 can transmit data using any suitable interface or protocol, such as the internet small computer system interface, among others. The network 1512 may be a cellular network, a radio network, a wide area network (WAN), a local area network (LAN), or the Internet, among others. An external computing device may connect to the computer system 1500 through the network 1512. In some examples, an external computing device may be an external webserver or a cloud computing node.

It is to be understood that the block diagram of FIG. 6 is not intended to indicate that the computer system 1500 is to include all of the components shown in FIG. 6. Rather, the computer system 1500 can include any appropriate fewer or additional components not illustrated in FIG. 6 (e.g., additional memory components, embedded controllers, modules, additional network interfaces, etc.). Further, the embodiments described herein with respect to computer system 1500 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   receiving, by a processor, a physical design block and a physical hierarchy of a chip design of a chip;
   extracting, by the processor, one or more features of a macro to be added to the chip design based on a logic synthesis of the chip design;
   receiving, by the processor, additional constraints as parameters for the macro, the additional constraints including a highest level of metal that can be used by the macro, an optimization option for the macro, a desired aspect ratio of the macro, and an uplift factor of the macro;
   predicting, by the processor, specifications of the macro to be added to the chip design based on the physical design block and the additional constraints, the predicting performed using a pre-trained machine learning model;
   using, by the processor, the specifications of the macro to perform a physical synthesis of the chip design to determine a physical layout of the chip.

2. The computer-implemented method of claim 1, wherein the physical design block is provided in a hardware descriptive language.

3. The computer-implemented method of claim 1, wherein, the one or more features of the macro extracted by the processor comprise a count of sequential elements, a count of combinational elements, a count of connectivity of each component, a count of primary input ports, a count of output ports.

4. The computer-implemented method of claim 1, wherein the specifications of the macro predicted by the machine learning model comprise an area and an aspect ratio of the macro.

5. The computer-implemented method of claim 1, wherein the machine learning model is a multi-output regression model.

6. The computer-implemented method of claim 1, wherein extracting the one or more features of the macro further comprises mapping components of the macro with a bill of materials based on the physical design.

7. The computer-implemented method of claim 1, wherein the pre-trained machine learning model is further provided one or more design guidelines that comprise constraints regarding placement of one or more components.

8. A system comprising:
   a memory; and
   one or more processing units coupled with the memory, the one or more processing units are configured to perform a method to support a design cycle of a chip, wherein performing the method comprises:
      receiving a physical design block and a physical hierarchy of a chip design of the chip;
      extracting one or more features of a macro to be added to the chip design based on a logic synthesis of the chip design;
      receiving, by the processor, additional constraints as parameters for the macro, the additional constraints including a highest level of metal that can be used by the macro, an optimization option for the macro, a desired aspect ratio of the macro, and an uplift factor of the macro;
      predicting specifications of the macro to be added to the chip design based on the physical design block and the additional constraints, the predicting performed using a pre-trained machine learning model;
      using the specifications of the macro to perform a physical synthesis of the chip design to determine a physical layout of the chip.

9. The system of claim 8, wherein the physical design block is provided in a hardware descriptive language.

10. The system of claim 8, wherein, the one or more features of the macro extracted by the processor comprise a count of sequential elements, a count of combinational elements, a count of connectivity of each component, a count of primary input ports, a count of output ports.

11. The system of claim 8, wherein the specifications of the macro predicted by the machine learning model comprise an area and an aspect ratio of the macro.

12. The system of claim 8, wherein the machine learning model is a multi-output regression model.

13. The system of claim 8, wherein extracting the one or more features of the macro further comprises mapping components of the macro with a bill of materials based on the physical design.

14. The system of claim 8, wherein the pre-trained machine learning model is further provided one or more design guidelines that comprise constraints regarding placement of one or more components.

15. A computer program product comprising a computer-readable memory that has computer-executable instructions stored thereupon, the computer-executable instructions when executed by a processor cause the processor to perform a method that comprises:

receiving a physical design block and a physical hierarchy of a chip design of a chip;

extracting one or more features of a macro to be added to the chip design based on a logic synthesis of the chip design;

receiving, by the processor, additional constraints as parameters for the macro, the additional constraints including a highest level of metal that can be used by the macro, an optimization option for the macro, a desired aspect ratio of the macro, and an uplift factor of the macro;

predicting specifications of the macro to be added to the chip design based on the physical design block and the additional constraints, the predicting performed using a pre-trained machine learning model;

using the specifications of the macro to perform a physical synthesis of the chip design to determine a physical layout of the chip.

16. The computer program product of claim 15, wherein the physical design block is provided in a hardware descriptive language.

17. The computer program product of claim 15, wherein, the one or more features of the macro extracted by the processor comprise a count of sequential elements, a count of combinational elements, a count of connectivity of each component, a count of primary input ports, a count of output ports.

18. The computer program product of claim 15, wherein the specifications of the macro predicted by the machine learning model comprise an area and an aspect ratio of the macro.

19. The computer program product of claim 15, wherein the machine learning model is a multi-output regression model.

20. The computer program product of claim 15, wherein extracting the one or more features of the macro further comprises mapping components of the macro with a bill of materials based on the physical design.

* * * * *